June 10, 1969 J. W. GRIENINGER 3,449,656
HARMONIC FREE FREQUENCY MULTIPLIER UTILIZING CAPACITOR INTEGRATION
Filed May 29, 1967 Sheet 1 of 2

INVENTOR
JEAN W. GRIENINGER
BY Jeffers and Young
ATTORNEYS

INVENTOR.
JEAN W. GRIENINGER
BY
Jeffers and Young
ATTORNEYS

United States Patent Office 3,449,656

Patented June 10, 1969

3,449,656

HARMONIC FREE FREQUENCY MULTIPLIER UTILIZING CAPACITOR INTEGRATION

Jean W. Grieninger, Fort Wayne, Ind., assignor to The Magnavox Company, Fort Wayne, Ind., a corporation of Delaware Filed May 29, 1967, Ser. No. 641,788

Int. Cl. H02m *5/00, 5/16, 5/22*

U.S. Cl. 321—66 4 Claims

ABSTRACT OF THE DISCLOSURE

A sine wave signal is applied to a Schmitt trigger circuit which converts the applied sine wave signal to a square wave signal. The square wave signal is integrated by a capacitor, and applied to a band pass filter which provides a sine wave signal having a selected integral multiple of the applied sine wave signal.

*Background of the invention*

My invention relates to a frequency multiplier circuit, and particularly to a frequency multiplier circuit for generating an output signal of a frequency that is an integral multiple of the frequency of an applied input signal and that is relatively free of other harmonic frequencies.

Many circuits have been devised for frequency multiplication or harmonic frequency generation. These circuits generally fall within two basic categories. The first category includes circuits having overdriven amplifiers, amplifiers biased beyond cutoff, or other nonlinear devices which distort the applied input signal so that the output signal contains harmonic frequencies of the applied input signal. The second category includes circuits having a pulse generator which utilizes the applied input signal to synchronize or control the frequency of the output pulse signal which contains the desired harmonic frequencies of the applied input signal.

In the first category, Class C amplifiers are typical. Class C amplifiers may operate as oscillators or as harmonic frequency generators. While Class C amplifiers have the advantage of being relatively simple circuits, they also have several disadvantages. First, the harmonic frequency content of signals produced by a Class C amplifier is sensitive to the operating parameters of the active element such as a vacuum tube or transistor. The harmonic frequency content is also sensitive to the shape or characteristics of the applied input signal. The amplitude of the output signal is dependent upon the amplitude of the input signal and the circuit supply voltages. In circuits where overdriving or saturation occurs, the loss of even order harmonic frequencies often occurs. The higher harmonic frequencies are limited by the output signal duration or width. In most cases, the amplitude of the harmonic frequencies decreases rapidly with the order of the harmonic frequency.

In the second category, the pulse generating circuits have been relatively complex. Further, these circuits produce harmonic frequencies in excess of or higher than the frequencies which may be desired, so that at radio frequencies, excessive interferring harmonics may be produced. Also, such circuits usually include several active elements, so that they are less reliable.

Accordingly, an object of my invention is to provide an improved frequency multiplier circuit.

Another object of my invention is to provide an improved frequency multiplier circuit which converts an input sine wave signal to an output sine wave signal having a frequency that is a desired integral multiple of the frequency of the input signal.

Another object of my invention is to provide an improved frequency multiplier circuit or harmonic generator that has a relatively small amount of undesired harmonic frequencies.

Another object of my invention is to provide an improved frequency multiplier circuit that produces a sine wave signal of a desired frequency having an integral multiple of an input signal, and that is relatively insensitive to variations in amplitude and shape of the input signal.

*Summary of the invention*

Briefly, these and other objects are achieved in accordance with my invention by a Schmitt trigger circuit to which a sine wave input signal is applied. The output of the Schmitt trigger circuit is coupled through a capacitor transformer to a band pass filter. The capacitor transformer provides the desired impedance transformation, and also integrates the output signal of the Schmitt trigger (which would normally be a square wave) so hat a sawtooth signal is applied to the band pass filter. The band pass filter is tuned to the desired harmonic frequency, so that a sine wave output signal is produced by the band pass filter. This output signal has a frequency which is the desired integral multiple of the frequency of the applied input signal, and which is relatively free of other harmonic frequencies.

*Brief description of the drawing*

The subject matter which I regard as my invention is particularly pointed out and distinctly claimed in the claims. The structure and operation of my invention, together with further objects and advantages, may be better undersood from the following description given in connection with the accompanying drawing, in which:

*Description of the preferred embodiment*

Figure 1:
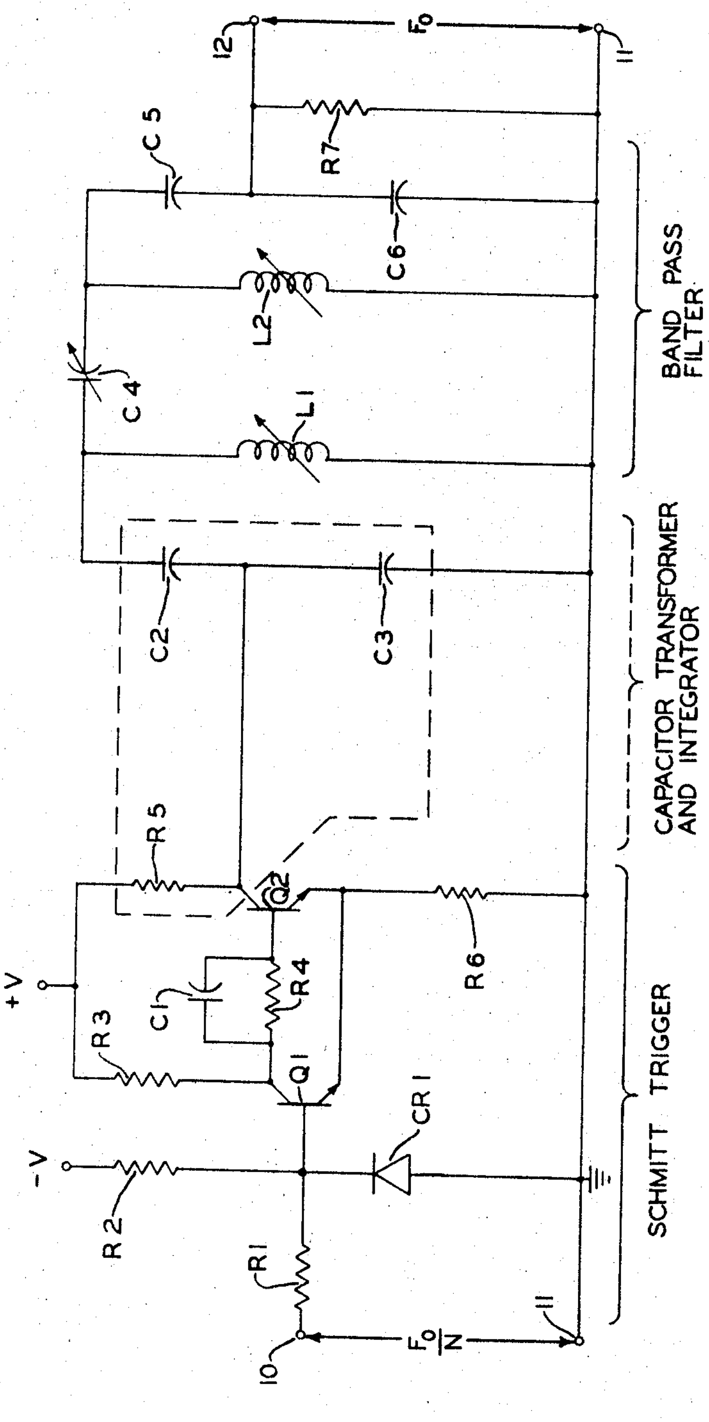
FIGURE 1 shows a schematic diagram of a preferred embodiment of my frequency multiplier circuit.

The circuit of FIGURE 1 is generally divided into the three indicated portions, the first portion including the Schmitt trigger circuit, the second portion including the capacitor transformer and integrator circuit, and the third portion including the band pass filter. In the Schmitt trigger, input signals which are to be frequency multiplied are applied to input terminals 10, 11. The input terminal 11 is a common terminal which may be connected to a point of reference potential such as ground, as shown. The input terminal 10 is coupled through a current limiting resistor R1 to the base electrode of an NPN type transistor Q1. The base electrode of the transistor Q1 is coupled to a bias network to keep the transistor Q1 turned off when no signal is applied to the input terminals 10, 11. This bias network includes a resistor R2 coupled to a source of direct current voltage which is negative relative to the common terminal 11, and which is indicated as —V. The bias network also includes a diode rectifier CR1 having its anode coupled to the common terminal 11. A direct current voltage, which is positive relative to the common terminal 11 and indicated as +V, is provided for the Schmitt trigger. This positive voltage is coupled through a resistor R3 to the collector of the transistor Q1, and through a resistor R5 to the collector of an NPN type transistor Q2. The emitters of the transistors Q1 and Q2 are coupled together and are coupled through a resistor R6 to the common terminal 11. The collector of the transistor Q1 is coupled to the base electrode of the transistor Q2 through a parallel connected resistor R4 and capacitor C1. The Schmitt trigger circuit as thus described, is known in the art.

The output of the Schmitt trigger circuit is derived from the collector of the transistor Q2, and is applied to the band pass filter through a capacitor transformer and integrator that includes the serially connected capacitors C2 and C3 and the resistor R5. The upper terminal of the capacitor C2 is coupled to a variable inductor L1 and to a variable capacitor C4. The inductor L1 and the capacitor C3 are connected to the common terminal 11. The capacitor C4 is connected through a variable inductor L2 which is connected to the common terminal 11. The capacitor C4 is also connected through a fixed capacitor C5 to an output terminal 12. The capacitor C5 is also coupled through a capacitor C6 to the common terminal 11. A resistor R7 is connected between the output terminal 12 and the common terminal 11. Output signals having a frequency that is the desired integral multiple of the input signals are derived from the output terminal 12. The frequency of these output signals is dependent upon the frequency to which the various inductors and capacitors of the band pass filter are tuned.

Figure 2:
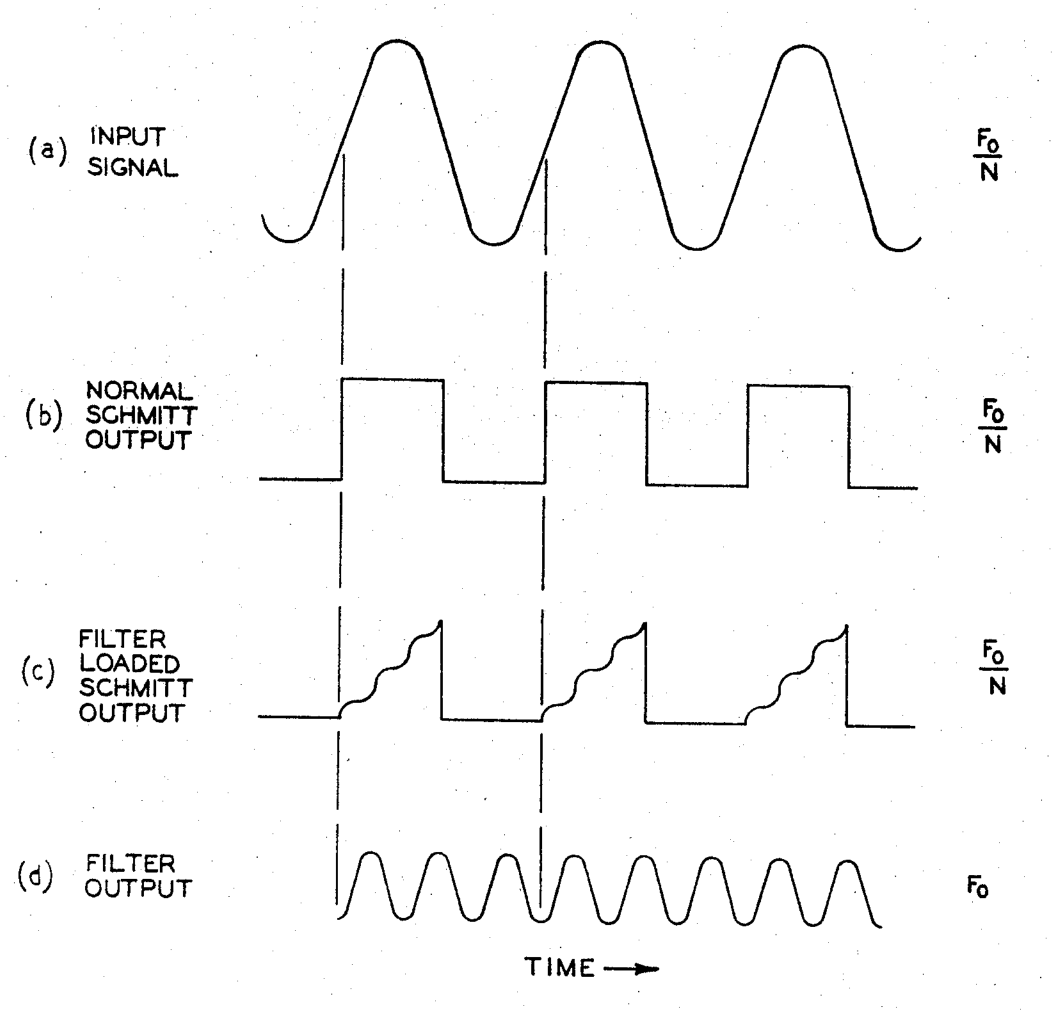
FIGURES 2*a* through 2*d* show wave forms illustrating the operation of the frequency multiplier circuit of FIGURE 1.

The operation of the frequency multiplier circuit of FIGURE 1 will be explained in connection with the wave forms shown in FIGURE 2. In FIGURE 2, the wave forms are plotted along a common time axes. FIGURE 2*a* shows an applied input signal having some frequency $F_0/N$, where N is an integral multiple representing the freguency multiplication desired. This input signal is applied to the input terminal 10 relative to the common terminal 11. The sine wave input signals normally cause the Schmitt trigger to produce square wave output signals at the collector of the transistor Q2, as shown in FIGURE 2*b*. However, the resistor R5 and the capacitor C3 in the band pass filter cause the Schmitt trigger output signal at the collector of the transistor Q2 to have the integrated form shown in FIGURE 2*c*. This signal in FIGURE 2*c* has the same frequency$F_0/N$ as the input signal. The signal in FIGURE 2*c* may be generally described as a sawtooth signal having variations or fluctuations in the rising portion which corresponds to the output frequency $F_0$. The sawtooth signal of FIGURE 2*c* is applied to the band pass filter which filters the sawtooth signal so that output signal at the terminals 12, 11 have the appearance shown in FIGURE 2*d*. In other words, the band pass filter is tuned to the output frequency $F_0$. The output signal is a sine wave having the desired output frequency $F_0$. In FIGURE 2, N is 3, so that the output frequency is is three times the input frequency.

The capacitors C2 and C3 provide a transformer which matches the impedance of the band pass filter to the output impedance of the Schmitt trigger. The resistor R5 and the capacitor C3 cause the Schmitt trigger to produce an integrated or sawtooth signal at the collector of the resistor Q2 which varies in accordance with the following equation:

$$E=\frac{2e}{\pi}\left(\sin x-\tfrac{1}{2}\sin 2x+\tfrac{1}{3}\sin 3x-\tfrac{1}{4}\sin 4x\ .\ .\ .\ \frac{1}{N}\sin Nx\right)$$

In this equation, E is the voltage at the collector of the transistor Q2, *e* is the peak voltage of the sawtooth wave shown in FIGURE 2*c*, *x* is the frequency of the input signtl shown in FIGURE 2*a*, and N is the integer representing the highest frequency response of the circuit. The signal represented by this equation contains the fundamental and harmonic frequencies of the input signal. This signal is filtered by the band pass filter to produce the desired output signal having a frequency that is an integral multiple of the frequency of the input signal.

It will thus bee seen that my frequency multiplier circuit provides an improved arrangement for producing an output signal having a frequency that is any desired even or odd integral multiple of the frequency of an applied input signal. This circuit is relatively simple, and produces this frequency multiplication through a relatively simple Schmitt trigger circuit and band pass filter. The circuit has only two active elements, and the filter may be reliably construcuted to be relatively stable against temperature changes and other variations in environmental conditions. The circuit is not affected by changes in amplitude or form of the input signal as long as this amplitude exceeds a given threshold set by the Schmitt trigger circuit. Therefore, the output signal is constant despite changes in the input signal amplitude and form. My circuit is relatively simple compared to the circuits in the second category since it does not require amplification of the input signal. Also, the integrating or sawtooth signal provides more output for a given voltage. Persons skilled in the art will appreciate that modifications may be made. For example, the transistors Q1 and Q2 may be PNP type transistors. And while I prefer the Schmitt trigger circuit, other types of squaring circuits may be used with appropriate circuit modifications. Further, other types of band pass filter configurations may be used in place of the particular band pass filter shown in FIGURE 1. Therefore, while my invention has been described with reference to a particular embodiment, it is to be understood that modifications may be made without departing from the spirit of the invention or from the scope of the claims.

What I claim as new and desire to secure by Letters Patent of the United State is:

1. A frequency multiplier circuit for producing an output signal having a frequency that is a desired integral multiple of the frequency of an input signal, comprising:

(a) a Schmitt trigger circuit having an input to which said input signal is applied, and having an output for producing a substantially square wave in response to said input signal;

(b) a band pass filter having an input, an output, and a band pass filter circuit tuned to the desired frequency of said output signal;

(c) and a capacitor transformer and integrating circuit coupling said Schmitt trigger output to said filter input and integrating said square waves produced by said Schmitt trigger.

2. The frequency multiplier circuit of claim 1 wherein said capacitor trannsformer comprises a portion of said band pass filter.

3. An improved frequency multiplier circuit for converting input signals of a frequency $F/N$ to output signals of a frequency F, where N is any integer, comprising:

(a) a Schmitt trigger having an input circuit, an output circuit, and a pair of current control devices coupled together to produce square wave signals in response to and of the same frequency as said input signal;

(b) a band pass filter having an input circuit and an output circuit, and being tuned to pass a band of frequencies centered about said frequency F;

(c) and a capacitor and integrator circuit coupling said Schmitt trigger output circuit to said band pass filter input circuit for matching the impedance of said Schmitt trigger output circuit and said band pass filter input circuit and for integrating said square wave signal produced by said Schmitt trigger.

4. The improved frequency multiplier circuit of claim 3 wherein said capacitor circuit comprises a pair of serially connected capacitors which form a part of said band pass filter.

References Cited

UNITED STATES PATENTS

| | | | |
|---|---|---|---|
| 2,478,629 | 8/1949 | Hiehle | 321—66 |
| 3,303,358 | 2/1967 | Krausz | 307—290 X |

OTHER REFERENCES

"A Novel Method of Frequency Multiplication," by H. T. McAleer Electronic Industries, vol. 18, No. 8, August 1959, copy in 321/66 (pp. 95–98).

JOHN F. COUCH, *Primary Examiner.*

G. GOLDBERG, *Assistant Examiner.*

U.S. Cl X.R.

307—271, 290; 321—69; 328—15